(12) United States Patent
Huang

(10) Patent No.: US 7,795,620 B2
(45) Date of Patent: Sep. 14, 2010

(54) TRANSISTOR STRUCTURE AND DYNAMIC RANDOM ACCESS MEMORY STRUCTURE INCLUDING THE SAME

(75) Inventor: Wen-Kuei Huang, Hsinchu County (TW)

(73) Assignee: Nanya Technology Corp., Kueishan, Tao-Yuan Hsien (TW)

(*) Notice: Subject to any disclaimer, the term of this patent is extended or adjusted under 35 U.S.C. 154(b) by 0 days.

(21) Appl. No.: 12/338,988

(22) Filed: Dec. 18, 2008

(65) Prior Publication Data

US 2010/0052029 A1   Mar. 4, 2010

(30) Foreign Application Priority Data

Aug. 27, 2008   (TW) .............................. 97132675 A

(51) Int. Cl.
*H01L 27/108* (2006.01)
(52) U.S. Cl. .................. 257/68; 257/71; 257/E27.084; 257/E21.646
(58) Field of Classification Search .............. 257/68, 257/71, E27.084, E21.646, 906, 907, 908, 257/401, 457, E29.12, 296, 300, E21.415, 257/E21.649, E21.655, E21.657, E29.274, 257/E29.275, 330, E29.118, E29.146
See application file for complete search history.

(56) References Cited

U.S. PATENT DOCUMENTS

| | | | |
|---|---|---|---|
| 7,042,047 B2 | 5/2006 | Eppich | |
| 2005/0280079 A1* | 12/2005 | Jones | ......................... 257/330 |
| 2006/0006444 A1* | 1/2006 | Leslie | ......................... 257/300 |
| 2007/0018223 A1 | 1/2007 | Abbott | |

* cited by examiner

*Primary Examiner*—Davienne Monbleau
*Assistant Examiner*—Shweta Mulcare
(74) *Attorney, Agent, or Firm*—Winston Hsu

(57) ABSTRACT

A dynamic random access memory structure is disclosed, in which, the active area is a donut-type pillar at which a novel vertical transistor is disposed and has a gate filled in the central cavity of the pillar and upper and lower sources/drains located in the upper and the lower portions of the pillar respectively. A buried bit line is formed in the substrate beneath the transistor. A word line is horizontally disposed above the gate. A capacitor is disposed above the word line as well as the gate and electrically connected to the upper source/drain through a node contact. The node contact has a reverse-trench shape with the top surface electrically connected to the capacitor and with the bottom of the sidewalls electrically connected to the upper source/drain. The word line passes through the space confined by the reverse-trench shape.

13 Claims, 9 Drawing Sheets

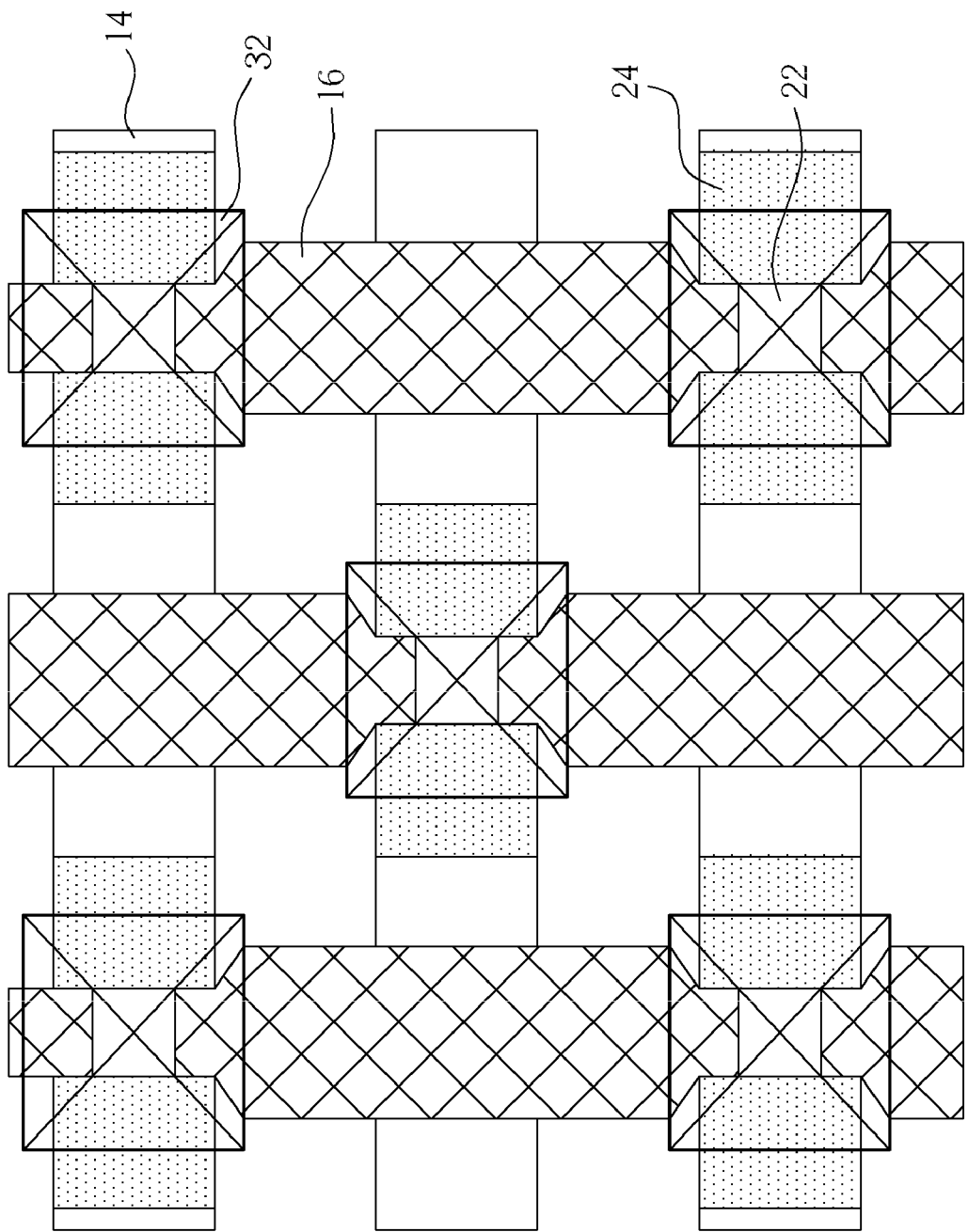

TRANSISTOR STRUCTURE AND DYNAMIC RANDOM ACCESS MEMORY STRUCTURE INCLUDING THE SAME

BACKGROUND OF THE INVENTION

1. Field of the Invention

The present invention relates to a vertical transistor and a dynamic random access memory (DRAM) structure including therein the vertical transistor.

2. Description of the Prior Art

Along with the miniaturization of various electronic products, the dynamic random access memory (DRAM) elements have to meet the demand of high integration and high density. A DRAM structure includes a capacitor for holding a charge and a transistor for accessing the charge held in the capacitor. DRAMs with trench capacitors or stacked capacitors are widely used in the industry so as to well utilize space of chips to effectively reduce memory cell size. Typically, trench capacitors are fabricated inside deep trenches that are formed in a semiconductor substrate by an etching process, followed by the manufacturing process of transistors. Stacked capacitors are generally formed after formation of transistors, and located on the transistors. There are various stack types, such as, plane, pillar, fin-type, and cylinder. Also, there are various types of transistors, which may be categorized into two broad categories: planar transistor structures and vertical transistor structures, based upon the orientation of the channel region relative to the primary surface of semiconductor substrate. Specifically, planar transistor devices are devices in which the electric current flows in the gate channel in a direction parallel to the primary surface of the semiconductor substrate, and vertical transistor devices are devices in which the electric current flows in the gate channel in a direction substantially orthogonal to the primary surface of the semiconductor substrate.

Vertical transistors with surrounding gate transistors (SGT) have been applied to a layout with a cell unit of 4 $F^2$. F stands for feature size. Most of these SGT structures have a gate channel formed in the pillar per se, a gate dielectric layer enveloping the pillar on the outer wall, and a gate material layer enveloping the gate dielectric layer to serve as a gate. Accordingly, the gate surrounds the perimeter of the pillar, and the source/drain regions are formed in the top portion and the bottom portion of the pillar, respectively. The pillar can be made by either directly etching a substrate or forming an epitaxial layer followed by etching. The former process can be used for mass production, and the latter process is relatively easier. For example, a memory structure having an SGT structure is disclosed in U.S. Pat. No. 7,042,047, in which a gate surrounds a perimeter of the epitaxial post, i.e. the epitaxial post serves as a gate channel. However, the epitaxial silicon is often inferior in properties to the bulk silicon, such that transistors such obtained tend to be inferior in performance. The SGT also faces a challenge of floating body effect due to the source/drain placed at the top/bottom of the channel. It will induce an uncontrollable device threshold voltage.

Therefore, there is still a need for a novel SGT structure with excellent gate channel properties so as to avoid the floating body effect and a DRAM structure including the same.

SUMMARY OF THE INVENTION

An objective of the present invention is to provide a DRAM structure with an SGT structure having a particular design, in which the gate is disposed inside a donut-type pillar formed of, especially, a single-crystal silicon wafer. Accordingly, the gate channel can be single crystal silicon without the disadvantages of epitaxial silicon channels. The DRAM structure of the present invention may be also scaled to be a 4 $F^2$ memory cell unit.

The DRAM structure according to the present invention includes a substrate, a transistor, a bit line, a word line, and a capacitor. The substrate has a plane and a donut-type pillar extending upward from the plane of the substrate. Thus, the substrate comprises a donut-type pillar integrally extending upward from the substrate and has a cavity defined in a central portion of the donut-type pillar. The transistor is disposed at the donut-type pillar. The transistor comprises a gate filled in the central cavity inside the donut-type pillar, an upper source/drain disposed in the upper portion of the donut-type pillar, and a lower source/drain disposed in the lower portion of the donut-type pillar. The bit line is disposed in the substrate beneath the transistor, electrically connected to the lower source/drain, and electrically isolated from the gate. The word line is disposed above the gate and electrically connected to the gate. The capacitor is disposed above the word line and the gate and electrically connected to the upper source/drain.

The transistor structure according to the present invention includes a substrate, a gate, an upper source/drain, and a lower source/drain. The substrate is in a shape of donut-type pillar. The gate dielectric layer covers an inner wall of the donut-type pillar. The gate is filled in a central cavity of the donut-type pillar and separated from the inner wall of the donut-type pillar by the gate dielectric layer. The upper source/drain is disposed at the upper portion of the donut-type pillar. The lower source/drain is disposed at the lower portion of the donut-type pillar.

In comparison with the conventional techniques, in the DRAM structure of the present invention, the SGT is formed on the substrate inside the donut-type pillar and the donut-type pillar is used to serve as a gate channel. There are many advantages that it is suitable for mass production since the donut-type pillar can be defined directly by bulk silicon etching; the gate channel can be formed of single crystal silicon with better properties; and the gate structures can be easily combined with the capacitor through a node contact having a distinct structure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 9 shows a schematic graph illustrating a checkerboard memory cell array layout of the DRAM structure according to the present invention.

DETAILED DESCRIPTION

Figure 1:
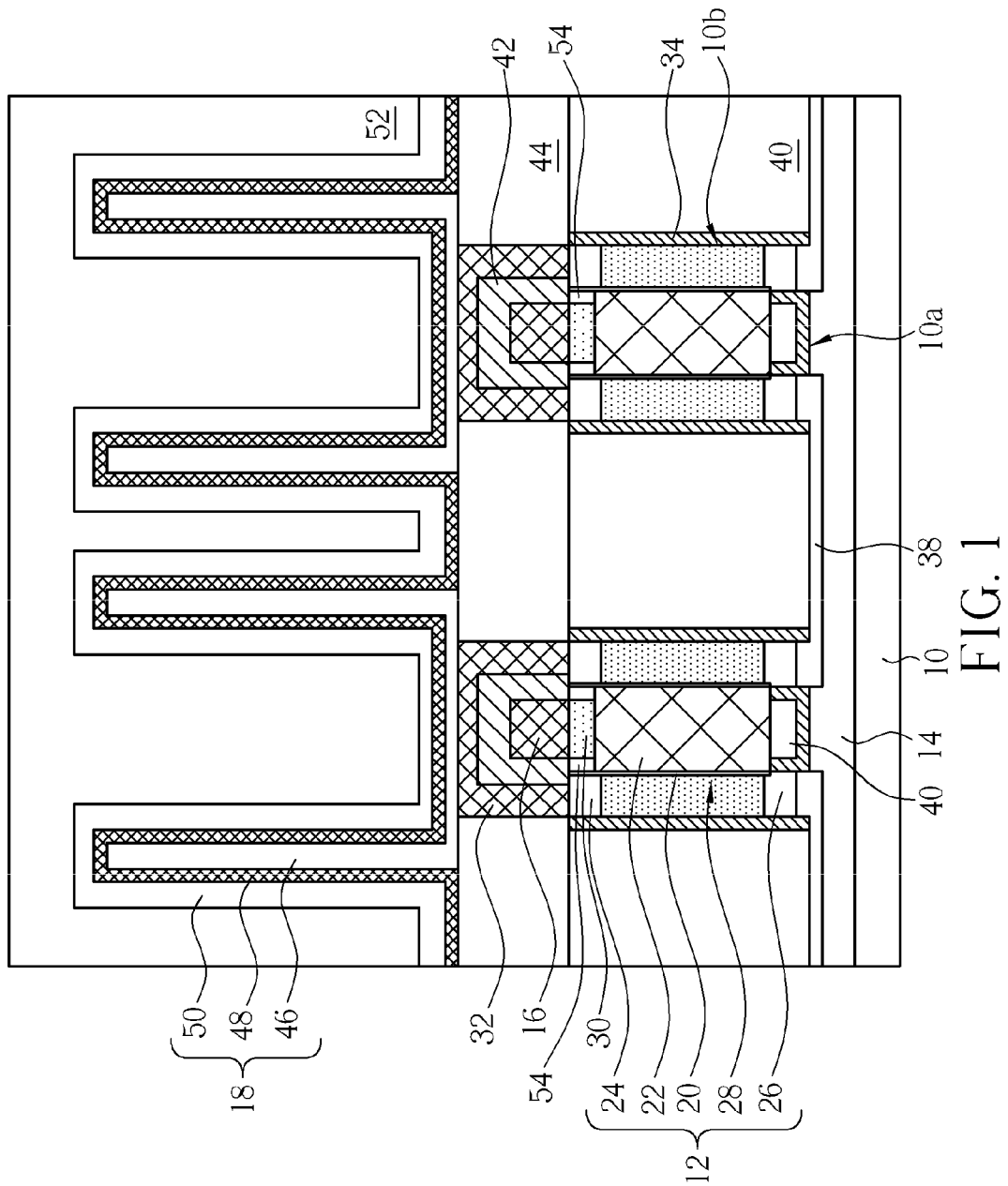
FIG. 1 shows a schematic cross section view illustrating an embodiment of the DRAM structure according to the present invention.

Referring to FIG. 1, the DRAM structure according to the present invention includes a substrate 10, a transistor 12, a bit line 14, a word line 16, and a capacitor 18. The substrate 10 has a plane 10a and a donut-type pillar 10b extending upward from the plane 10a of the substrate 10. The donut-type pillar 10b serves as an active area. The donut-type pillar 10b is in an annular shape, and therefore it has an outer wall at the perimeter of the pillar, a central cavity defined in a central portion of the outer wall, and an inner wall surrounding the central cavity.

The annular shape herein may be round, square, or in other shape. The thickness of the annular wall is not particularly limited and may be preferably for example 100 Å to 3000 Å, and more preferably 500 Å to 2000 Å, depending on the process technology and the device properties. The transistor 12 is disposed inside the donut-type pillar 10b and includes a gate dielectric layer 20, a gate 22, an upper source/drain 24, a lower source/drain 26, and a gate channel 28. The gate dielectric layer 20 covers the inner wall of the donut-type pillar and surrounds the inner wall. The gate 22 is formed of a gate material layer filled in a central cavity of the donut-type pillar. The gate 22 is separated from the inner wall of the donut-type pillar 10b by the gate dielectric layer 20. The upper source/drain 24 is disposed in the upper portion of the donut-type pillar 10b. The lower source/drain 26 is disposed in the lower portion of the donut-type pillar 10b. The donut-type pillar between the upper source/drain and the lower source/drain serves as the gate channel 28.

The bit line 14 is formed in the substrate beneath the transistor 12, electrically connected to the lower source/drain 26, and electrically isolated from the gate 22 by an isolation structure. The word line 16 is horizontally disposed above the gate 22 and electrically connected to the gate 22 through a conductive plug 30. That is, the conductive plug 30 is formed between the word line 16 and the gate 22 and electrically connects to the word line 16 and the gate 22 respectively. The capacitor 18 is disposed above the word line 16 and the gate 22. The capacitor 18 is electrically connected to the upper source/drain 24 through a node contact 32. The node contact 32 may be in a form similar to a reversed trench, looked like a cover without the front side and the back side. That is, the cross section view of the node contact 32 would be in a reversed-U shape. The node contact 32 is electrically connected to the capacitor 18 with a top of the reversed-U-shaped cover and electrically connected to the upper source/drain 24 via tow sides of the reversed-U-shaped cover. The word line 16 passes through the empty space confined by the reversed-U-shaped node contact 32, and is electrically isolated from the node contact 32.

Figure 2:
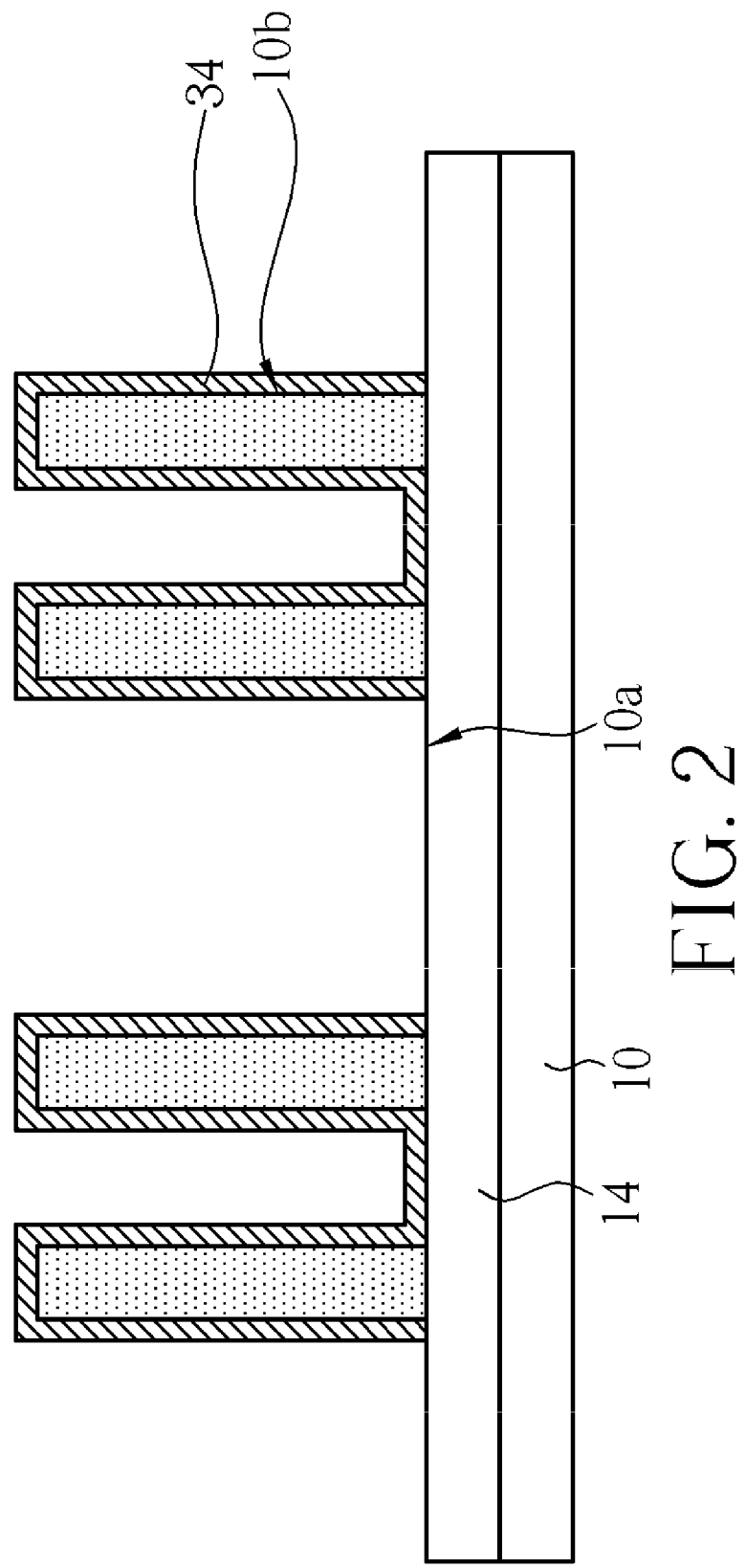
FIGS. 2 to 7 show schematic cross section views illustrating an embodiment of the method of making a DRAM structure according to the present invention.

FIGS. 2 to 7 illustrate an embodiment of making the DRAM structure according to the present invention. First, as shown in FIG. 2, a substrate 10, such as semiconductor substrate or silicon substrate, is provided. A plurality of donut-type pillars 10b are formed at the substrate 10 to serve as active regions. The method to form the donut-type pillar 10b is not particularly limited. For example, one method may directly etch the surface of the silicon substrate to form the shape of the donut-type pillar, or another method may perform a selective epitaxial growth on the surface of the substrate to form an epitaxial structure in a shape of donut-type pillar or to form an epitaxial layer followed by etching to form the donut-type pillar. It is preferably to direct etch the surface of the silicon substrate per se to form a donut-type pillar, due to better properties of the gate channel constituted by single crystal silicon. The etching may be performed in one or two stages. In one-stage etching, the desired donut-type pillar can be obtained by one etching using a patterned hard mask. In two-stage etching, a block pillar may be formed first by the first etching carried out on the substrate and a hollow donut-type pillar are then formed by the second etching to remove the central portion of the block pillar; or a central hollow space can be formed first by the first etching carried out on the substrate followed by etching away the outside portion of the substrate to form the donut-type pillar.

Thereafter, a blanket-like silicon oxide layer is formed to cover the donut-type pillars 10b and the plane 10a of the substrate 10. Then, the silicon oxide layer on the plane 10a outside the donut-type pillars 10b is etched for removal and the silicon oxide layer on the donut-type pillars 10b, including that on the plane 10a inside the donut-type pillars 10b, remains to serve as spacers 34. Thereafter, an implantation is performed using the spacers 34 as masks to form bit lines 14 in the substrate beneath the donut-type pillars 10b.

Figure 3:
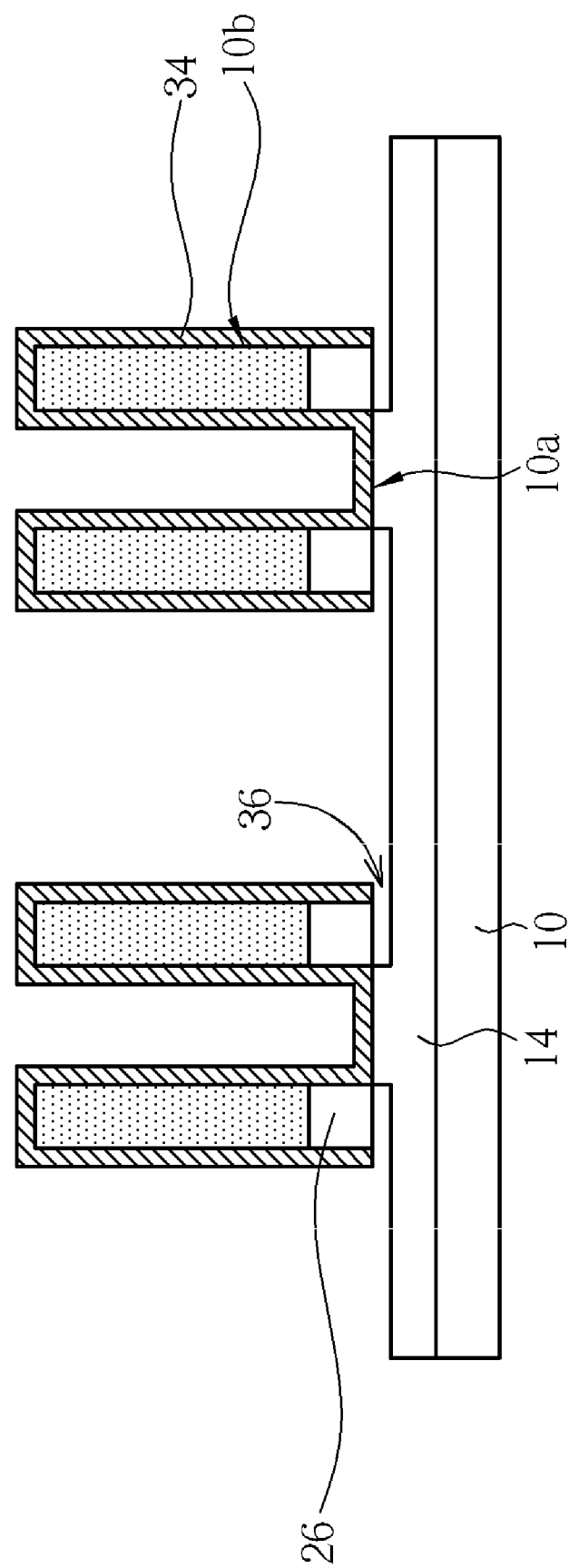

FIG. 3 illustrates to form a lower source/drain of the transistor at the lower portion of each donut-type pillar 10b. First, the substrate 10 beneath each donut-type pillar 10b for a location of a bit line 14 is etched away, such that the bottom of the donut-type pillar 10b is open to the environment. This can be achieved using for example a chemical downstream etching (CDE) or wet etching process. These etching processes are isotropic and have a pull back effect, i.e. after the plane of the silicon substrate is exposed by etching, the substrate beneath the donut-type pillar 10b may be etched away and then the etching is further progresses upward at the donut-type pillar 10b, by means of the isotropic etching. After a portion of the substrate 10 is etched away, the bottom of the donut-type pillar 10b is subjected to a doping process, for example a gas phase doping process with arsenic gas as an N+ type dopant. Since the substrate adjacent to the etched away region 36 is exposed, it can be doped. Besides, due to the high concentration of the gas dopant, the lower portion of the donut-type pillar 10b may become doped. Then, an annealing is further carried out, resulting in a lower source/drain 26. Since the pillar is in an annular shape, the lower source/drain 26 is in an annular shape (or a donut shape), too. The etched away region 36 may further extend outward, such that the two etched away regions beneath the two adjacent donut-type pillars are jointed.

Figure 4:
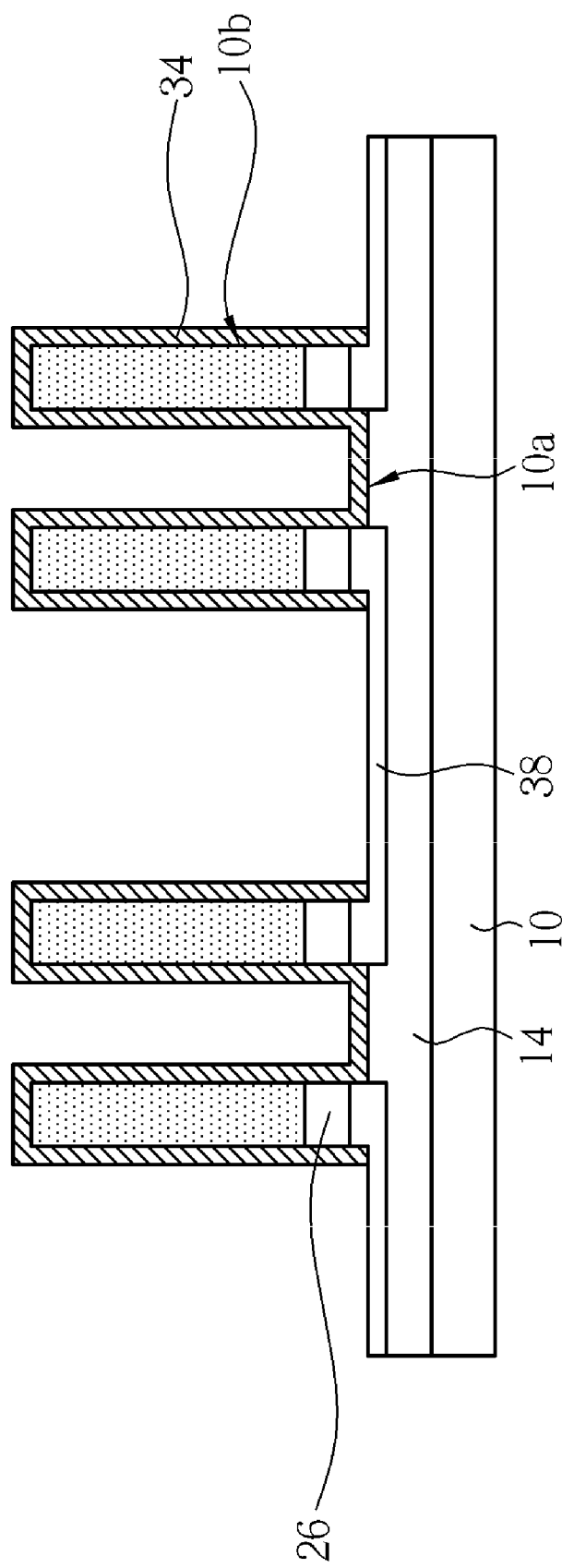

Thereafter, referring to FIG. 4, a metal silicidation process is carried out to form a metal silicide layer 38, such as titanium silicide, cobalt silicide or the like, on the surface of the exposed silicon substrate in the etched away regions 36. The metal silicide layer may fill the etched away regions 36 to serve as good contacts each between a lower source/drain 26 and a bit line 14, to reduce resistance.

Figure 5:
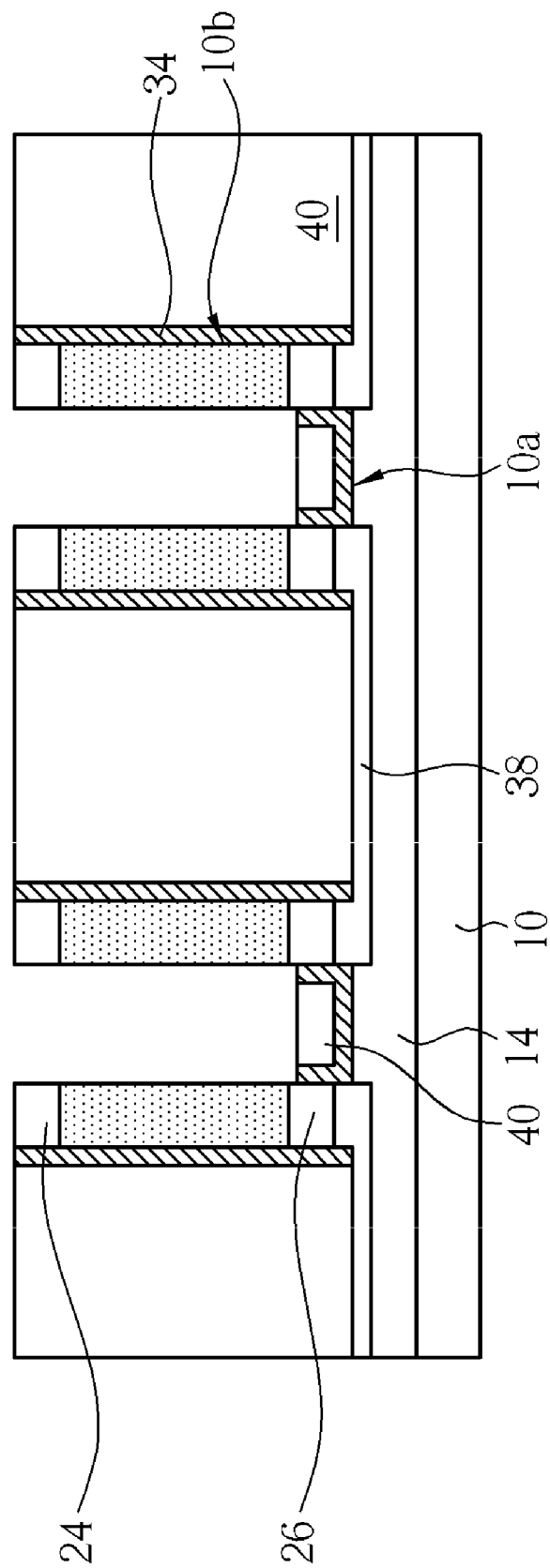

Thereafter, referring to FIG. 5, a dielectric layer 40, such as a tetraethyl orthosilicate (TEOS) layer, is deposited over the plane 10a of the substrate and to fill the central cavity of each donut-type pillar 10b, and planarized until the spacer 34 on the top of the donut-type pillar 10b. The spacer 34 on the top is removed and the top portion of the donut-type pillar 10b is subjected to a doping process to form an upper source/drain 24 in the upper portion of each donut-type pillar 10b. Accordingly, the upper source/drain 24 is also in a donut shape. Thereafter, the dielectric layer 40 and the spacer 34 inside each donut-type pillar 10b are partially etched away to empty the central cavity of the donut-type pillar 10b again. The removal may be carried out to a depth reaching or slightly exposing the top of the lower source/ drain 26, thereby to expose the inner wall of the donut-type pillar 10b per se. Accordingly, the remaining spacer 34 coats the entire outer wall and the lower portion of the inner wall of each donut-type pillar 10b and the plane 10a of the substrate 10 inside the donut-type pillar 10b (i.e. the bottom of the central cavity). The remaining spacer 34 also surrounds the remaining dielectric layer 40 inside the donut-type pillar 10b.

Figure 6:
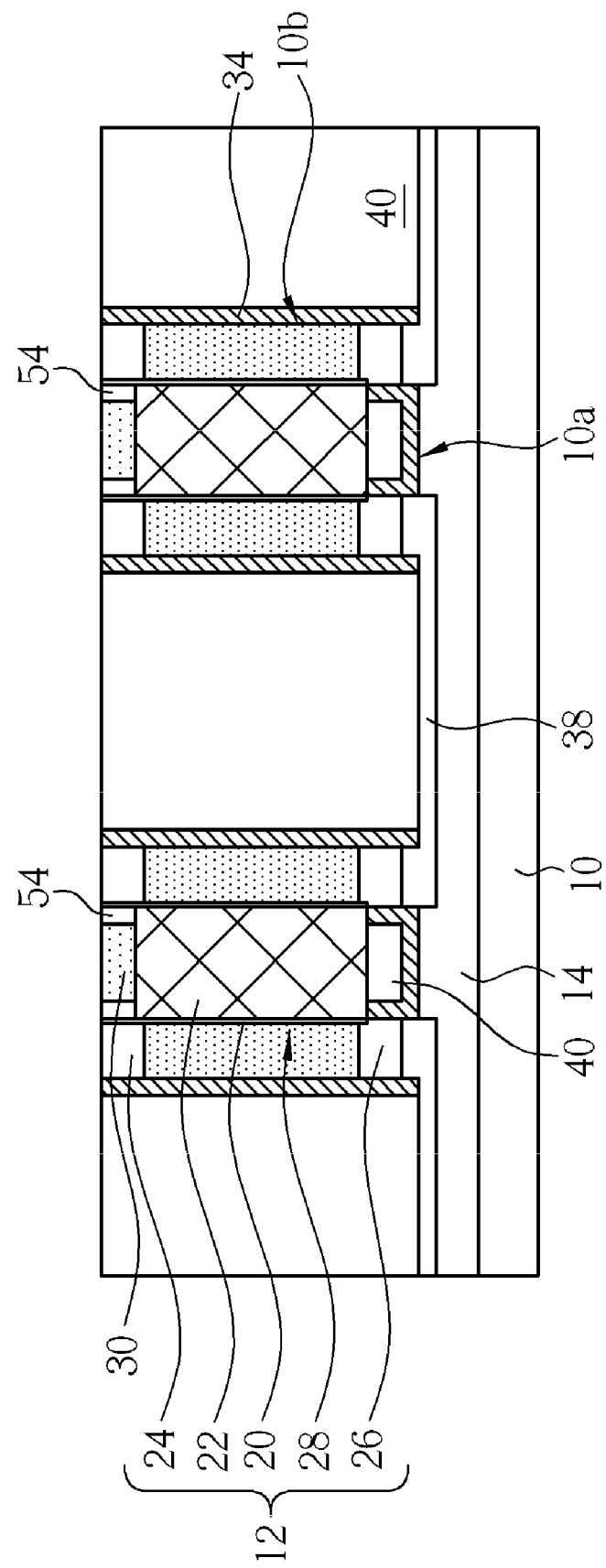

Thereafter, FIG. 6 illustrates to form a gate dielectric layer 20 on the inner wall of each donut-type pillar 10b. For example, a thermal process may be carried out to form a silicon oxide layer, or the gate dielectric layer may be formed of high-k material. Thereafter, a gate material is filled in the central cavity of each donut-type pillar 10b to form a gate 22. Gate material may be conductive material, such as polysilicon, metal, and the like. The gate material may fill the central cavity, be planarized, and then be etched back. When the device is smaller, the atomic layer deposition (ALD) method may be employed to fill metal into the central cavity, to form a metal gate. The height of the gate 22 obtained may reach the bottom of the upper source/drain 24 or a slightly overlapped with the upper source/drain 24. The bottom of the gate 22 and the bit line 14 are separated by an electric isolation structure which may be composed of a remaining dielectric layer 40 and a spacer 34. Accordingly, the silicon substrate of each donut-type pillar 10b per se between the upper source/drain 24 and the lower source/drain 26 and separated from the gate 22 by the dielectric layer 20 serves as a gate channel.

Thereafter, conductive plugs 30 are formed. The conductive plugs 30 serve as contacts between the word lines 16 and the gates 22 and are electrically isolated from the upper source/drain 24. First, a spacer 54 is formed above each gate 22 in the central cavity and on the inner wall of each donut-type pillar 10b, and a hole is formed in a central part of each spacer 54. Then contact material such as tungsten metal is filled in each hole and planarized, to form conductive plugs 30 each surrounded by the spacer 54 above the gate 22.

Figure 7:
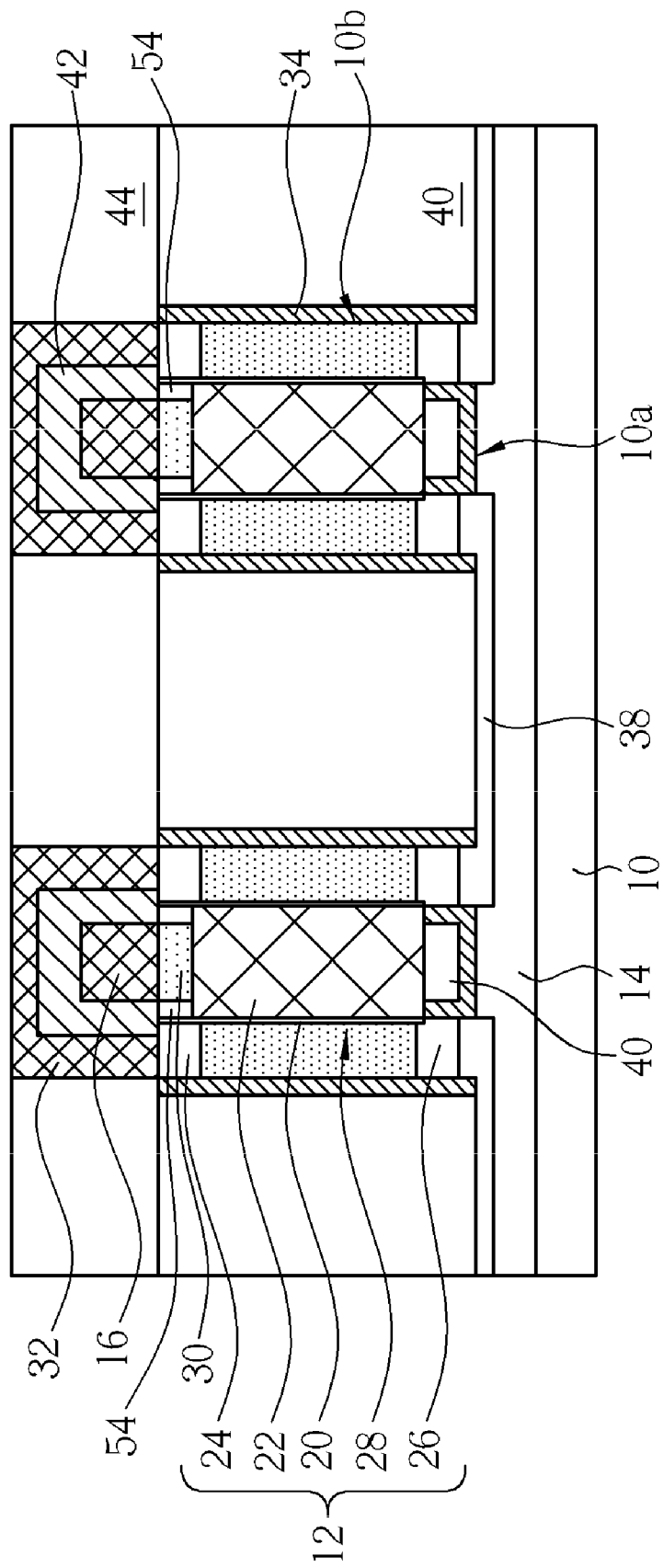

Thereafter, referring to FIG. 7, word lines 16 are formed horizontally on the conductive plugs 30. The word line 16 cross over the bit lines 14 under the transistors 12. The word lines 16 and the bit lines 14 may be substantially orthogonally intersected with each other, but not limited thereto. The word lines may be made through forming a layer of word line material followed by etching the word line material layer using a patterned silicon nitride layer as a hard mask. The etching process may be for example a photoengraving process (PEP) or a reactive ion etching (RIE). The word lines 16 may include polysilicon, or other conductive material, such as metal.

Thereafter, a dielectric layer, such as a silicon nitride layer, is formed and then subjected to a photolithography and etching process, such as RIE, to further form a spacer 42 to cover the top and two sides of each word line 16. But, the top of the upper source/drain 24 is exposed. Subsequently, node contacts 32 are formed as follows. First, a dielectric layer 44 is deposited to fill any recess and planarized such that the height thereof is higher than that of the spacer 42. For example, a borophosphosilicate glass (BPSG) layer may be formed, reflowed, and planarized. Then, the dielectric layer 44 is partially removed to form openings exposing the upper sources/drains 24 and the spacers 42 above the donut-type pillars 10b. This may be attained by etching, such as PEP/RIE. Then a node contact material is filled, for example a tungsten metal is deposited, into the openings and planarized to be substantially coplanar with the dielectric layer 44, thereby to form node contacts 32. Such obtained node contact 32 looks like a cover in a shape of reversed U with two sides and one top joining the two sides, in which the bottoms of the two sides contacts the upper source/drain 24 and the top contacts the lower electrode plate of the capacitor structure. The central space confined by the node contacts 32 provides the passing way for the word line 16. The node contacts 32 and the word lines 16 are electrically isolated from each other by virtue of the spacers 42 therebetween.

Thereafter, capacitors 18 each are formed to electrically connect the top of the node contact 32. The structure for the capacitor 18 is not particularly limited and may be a conventional capacitor, such as a stacked capacitor. Since the capacitor 18 contacts the node contact 32 with a plane surface, the electric connection is excellent and the resistance can be reduced. As shown in FIG. 1, the capacitor 18 is a conventional stacked capacitor and can be formed by conventional techniques, for example, a cylinder-typed lower electric plate 46 may be formed first, and then the a dielectric layer 48 is blanketly formed to cover the lower electrode plate 46. The dielectric layer 48 is preferably formed of high-k material. Thereafter, an upper electrode plate 50 is formed to cover the dielectric layer 48. Finally, a protection layer 52, such as a TEOS layer, may be formed to cover the substrate. The DRAM structure may be obtained as shown in FIG. 1.

Figure 8:
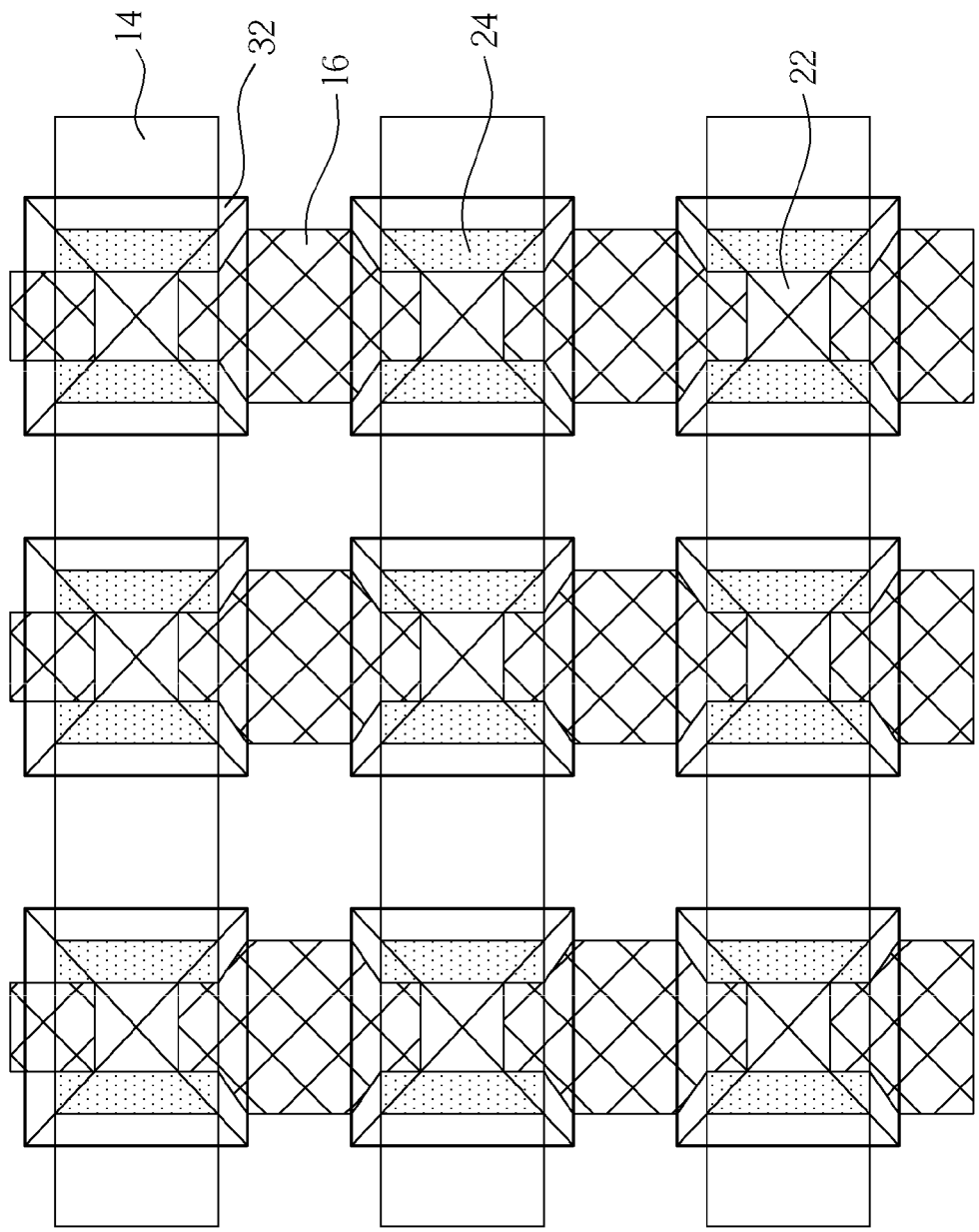
FIG. 8 shows a schematic graph illustrating a closest arrangement of the DRAM structure according to the present invention in a memory cell array layout.

The DRAM structure according to the present invention may be utilized in a memory cell array layout with a closest arrangement, as shown in FIG. 8, or in a checkerboard memory cell array layout as shown in FIG. 9. The size of the memory cell unit may be as small as 4 $F^2$. It may be noticed that each word line 16 is shrunk in the portion above the transistor to leave a space for the disposal of the spacer 42 and the node contact 32.

It may be further noticed that in the method of making the DRAM structure of the present invention, peripheral circuits may be simultaneously made using the steps in the process of making the DRAM structure to accomplish integration of processes. For example, a peripheral gates or word lines can be made simultaneously with the formation of the word line or node contact of the DRAM structure since the word line or node contact of the DRAM structure are disposed above the original surface of the silicon substrate.

Those skilled in the art will readily observe that numerous modifications and alterations of the device and method may be made while retaining the teachings of the invention.

What is claimed is:

1. A dynamic random access memory (DRAM) structure comprising:
   a substrate comprising a donut-type pillar formed in the substrate and having a cavity defined in a central portion of the donut-type pillar, wherein the donut-type pillar has a toroid shape;
   a transistor disposed inside and immediately surrounding the donut-type pillar and comprising:
   a gate filled in the cavity inside the donut-type pillar,
   an upper source/drain disposed in the upper portion of the donut-type pillar, and
   a lower source/drain disposed in the lower portion of the donut-type pillar;
   a bit line disposed in the substrate beneath the transistor and electrically connected to the lower source/drain, and electrically isolated from the gate;
   a word line disposed above the gate and electrically connected to the gate; and
   a capacitor disposed above the word line and the gate and electrically connected to the upper source/drain.

2. The DRAM structure of claim 1, wherein the upper source/drain is in a donut shape.

3. The DRAM structure of claim 1, wherein the lower source/drain is in a donut shape.

4. The DRAM structure of claim 3, wherein the upper source/drain is in a donut shape.

5. The DRAM structure of claim 1, wherein the bit line is electrically connected to the lower source/drain through a metal silicide layer contacting the bit line and the lower source/drain.

6. The DRAM structure of claim 2, wherein the bit line is electrically connected to the lower source/drain through a metal silicide layer contacting the bit line and the lower source/drain.

7. The DRAM structure of claim 3, wherein the bit line is electrically connected to the lower source/drain through a metal silicide layer contacting the bit line and the lower source/drain.

8. The DRAM structure of claim 4, wherein the bit line is electrically connected to the lower source/drain through a metal silicide layer contacting the bit line and the lower source/drain.

9. The DRAM structure of claim 8, further comprising a spacer covering an outer wall and a part of an inner wall of the donut-type pillar and a plane of the substrate inside the donut-type pillar, and a gate dielectric layer formed on the inner wall of the donut-type pillar.

10. The DRAM structure of claim 1, wherein the capacitor is electrically connected to the upper source/drain through a node contact comprising two sides and a top, wherein the top is electrically connected to the capacitor, the two sides are electrically connected to the upper source/drain, and the node contact crosses over the word line.

11. The DRAM structure of claim 9, wherein the capacitor is electrically connected to the upper source/drain through a node contact comprising two sides and a top, wherein the top is electrically connected to the capacitor, the two sides are electrically connected to the upper source/drain, and the node contact crosses over the word line.

12. The DRAM structure of claim 10, wherein the node contact is in an upside down U shape.

13. The DRAM structure of claim 11, wherein the node contact is in an upside down U shape.

* * * * *